（12) United States Patent
Mozsáry et al.

(10) Patent No.: US 11,047,934 B2
(45) Date of Patent: Jun. 29, 2021

(54) HALL SENSOR

(71) Applicant: ams AG, Unterpremstaetten (AT)

(72) Inventors: András Mozsáry, Premstaetten (AT); Roswitha Pummer, St. Peter A. O. (AT); Georg Roehrer, Lebring-Sankt Margarethen (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 15/743,234

(22) PCT Filed: Jun. 28, 2016

(86) PCT No.: PCT/EP2016/065042
§ 371 (c)(1),
(2) Date: Jan. 9, 2018

(87) PCT Pub. No.: WO2017/009038
PCT Pub. Date: Jan. 19, 2017

(65) Prior Publication Data
US 2019/0128975 A1 May 2, 2019

(30) Foreign Application Priority Data
Jul. 13, 2015 (EP) .................................... 15176460

(51) Int. Cl.
*G01R 33/07* (2006.01)
*G01R 33/10* (2006.01)
*G01R 33/00* (2006.01)

(52) U.S. Cl.
CPC ......... *G01R 33/10* (2013.01); *G01R 33/0094* (2013.01); *G01R 33/07* (2013.01)

(58) Field of Classification Search
CPC .... G01R 33/10; G01R 33/0094; G01R 33/07; G01R 33/075; G01R 33/072;
(Continued)

(56) References Cited

U.S. PATENT DOCUMENTS 6,320,373 B1 * 11/2001 Strasser ................. G01D 5/145
324/207.2
2007/0046287 A1 * 3/2007 Vervaeke ........... G01R 33/0094
324/251
(Continued)

FOREIGN PATENT DOCUMENTS

CN 103874929 A 6/2014
CN 104285158 A 1/2015
(Continued)

*Primary Examiner* — David M Schindler
(74) *Attorney, Agent, or Firm* — MH2 Technology Law Group, LLP

(57) ABSTRACT

A Hall sensor has at least four sensor terminals for connecting the Hall sensor and a plurality of Hall sensing element shaving element terminals. The Hall sensing elements are interconnected with the element terminals in a connection grid in between the sensor terminals, the connection having more than one dimension. The Hall sensing elements are physically arranged in an arrangement grid having more than one dimension and being different from the connection grid. At least some of the Hall sensing elements are connected to at least two adjacent Hall sensing elements in the connection grid.

18 Claims, 9 Drawing Sheets

(58) Field of Classification Search
CPC .... G01R 33/077; G01R 33/09; G01R 33/091;
G01R 33/093; G01R 33/095; G01R
33/096; G01R 33/098; G01D 5/142;
G01D 5/145; G01D 5/147
See application file for complete search history.

(56) References Cited

U.S. PATENT DOCUMENTS

| | | | |
|---|---|---|---|
| 2010/0042336 A1* | 2/2010 | Lee | G01N 27/9006 |
| | | | 702/38 |
| 2011/0187350 A1* | 8/2011 | Ausserlechner | G01D 5/145 |
| | | | 324/202 |
| 2013/0127453 A1 | 5/2013 | Ausserlechner | |
| 2014/0327435 A1* | 11/2014 | Rohrer | G01R 33/0094 |
| | | | 324/251 |
| 2014/0361766 A1 | 12/2014 | Roehrer | |
| 2015/0115950 A1* | 4/2015 | Cornils | G01R 33/07 |
| | | | 324/251 |
| 2015/0346289 A1 | 12/2015 | Ausserlechner | |

FOREIGN PATENT DOCUMENTS

| | | | | |
|---|---|---|---|---|
| CN | 104576918 A | 4/2015 | | |
| DE | 202014004425 U1 | 9/2014 | | |
| EP | 2873985 A1 | 5/2015 | | |
| WO | WO-2013053534 A1 * | 4/2013 | ......... | G01R 33/0094 |

* cited by examiner

|   | 1 | 2 | 3 | 4 | 5 | 6 | 7 | 8 |
|---|---|---|---|---|---|---|---|---|
| 1 | 55 | 45 | 65 | 35 | 75 | 25 | 85 | 15 |
| 2 | 54 | 44 | 64 | 34 | 74 | 24 | 84 | 14 |
| 3 | 56 | 46 | 66 | 36 | 76 | 26 | 86 | 16 |
| 4 | 53 | 43 | 63 | 33 | 73 | 23 | 83 | 13 |
| 5 | 57 | 47 | 67 | 37 | 77 | 27 | 87 | 17 |
| 6 | 52 | 42 | 62 | 32 | 72 | 22 | 82 | 12 |
| 7 | 58 | 48 | 68 | 38 | 78 | 28 | 88 | 18 |
| 8 | 51 | 41 | 61 | 31 | 71 | 21 | 81 | 11 |

Fig 10

| i/j | 1 | 2 | 3 | 4 | 5 | 6 | 7 | 8 |
|-----|---|---|---|---|---|---|---|---|
| 1 | 1/1 | 2/1 | 3/1 | 4/1 | 5/1 | 6/1 | 7/1 | 8/1 |
| 2 | 1/2 | 2/2 | 3/2 | 4/2 | 5/2 | 6/2 | 7/2 | 8/2 |
| 3 | 1/3 | 2/3 | 3/3 | 4/3 | 5/3 | 6/3 | 7/3 | 8/3 |
| 4 | 1/4 | 2/4 | 3/4 | 4/4 | 5/4 | 6/4 | 7/4 | 8/4 |
| 5 | 1/5 | 2/5 | 3/5 | 4/5 | 5/5 | 6/5 | 7/5 | 8/5 |
| 6 | 1/6 | 2/6 | 3/6 | 4/6 | 5/6 | 6/6 | 7/6 | 8/6 |
| 7 | 1/7 | 2/7 | 3/7 | 4/7 | 5/7 | 6/7 | 7/7 | 8/7 |
| 8 | 1/8 | 2/8 | 3/8 | 4/8 | 5/8 | 6/8 | 7/8 | 8/8 |

(a)

| i/j | 5 | 4 | 6 | 3 | 7 | 2 | 8 | 1 |
|-----|---|---|---|---|---|---|---|---|
| 5 | 5/5 | 4/5 | 6/5 | 3/5 | 7/5 | 2/5 | 8/5 | 1/5 |
| 4 | 5/4 | 4/4 | 6/4 | 3/4 | 7/4 | 2/4 | 8/4 | 1/4 |
| 6 | 5/6 | 4/6 | 6/6 | 3/6 | 7/6 | 2/6 | 8/6 | 1/6 |
| 3 | 5/3 | 4/3 | 6/3 | 3/3 | 7/3 | 2/3 | 8/3 | 1/3 |
| 7 | 5/7 | 4/7 | 6/7 | 3/7 | 7/7 | 2/7 | 8/7 | 1/7 |
| 2 | 5/2 | 4/2 | 6/2 | 3/2 | 7/2 | 2/2 | 8/2 | 1/2 |
| 8 | 5/8 | 4/8 | 6/8 | 3/8 | 7/8 | 2/8 | 8/8 | 1/8 |
| 1 | 5/1 | 4/1 | 6/1 | 3/1 | 7/1 | 2/1 | 8/1 | 1/1 |

| i/j | 1 | 2 | 3 | 4 | 5 | 6 | 7 | 8 |
|-----|---|---|---|---|---|---|---|---|
| 1 | 1/1 | 2/1 | 3/1 | 4/1 | 5/1 | 6/1 | 7/1 | 8/1 |
| 2 | 1/2 | 2/2 | 3/2 | 4/2 | 5/2 | 6/2 | 7/2 | 8/2 |
| 3 | 1/3 | 2/3 | 3/3 | 4/3 | 5/3 | 6/3 | 7/3 | 8/3 |
| 4 | 1/4 | 2/4 | 3/4 | 4/4 | 5/4 | 6/4 | 7/4 | 8/4 |
| 5 | 1/5 | 2/5 | 3/5 | 4/5 | 5/5 | 6/5 | 7/5 | 8/5 |
| 6 | 1/6 | 2/6 | 3/6 | 4/6 | 5/6 | 6/6 | 7/6 | 8/6 |
| 7 | 1/7 | 2/7 | 3/7 | 4/7 | 5/7 | 6/7 | 7/7 | 8/7 |
| 8 | 1/8 | 2/8 | 3/8 | 4/8 | 5/8 | 6/8 | 7/8 | 8/8 |

(a)

| i/j | 5 | 4 | 6 | 3 | 7 | 2 | 8 | 1 |
|-----|---|---|---|---|---|---|---|---|
| 5 | 5/5 | 4/5 | 6/5 | 3/5 | 7/5 | 2/5 | 8/5 | 1/5 |
| 4 | 5/4 | 4/4 | 6/4 | 3/4 | 7/4 | 2/4 | 8/4 | 1/4 |
| 6 | 5/6 | 4/6 | 6/6 | 3/6 | 7/6 | 2/6 | 8/6 | 1/6 |
| 3 | 5/3 | 4/3 | 6/3 | 3/3 | 7/3 | 2/3 | 8/3 | 1/3 |
| 7 | 5/7 | 4/7 | 6/7 | 3/7 | 7/7 | 2/7 | 8/7 | 1/7 |
| 2 | 5/2 | 4/2 | 6/2 | 3/2 | 7/2 | 2/2 | 8/2 | 1/2 |
| 8 | 5/8 | 4/8 | 6/8 | 3/8 | 7/8 | 2/8 | 8/8 | 1/8 |
| 1 | 5/1 | 4/1 | 6/1 | 3/1 | 7/1 | 2/1 | 8/1 | 1/1 |

| i/j | 1 | 2 | 3 | 4 | 5 | 6 | 7 | 8 |
|-----|---|---|---|---|---|---|---|---|
| 1 | 1/1 | 2/1 | 3/1 | 4/1 | 5/1 | 6/1 | 7/1 | 8/1 |
| 2 | 1/2 | 2/2 | 3/2 | 4/2 | 5/2 | 6/2 | 7/2 | 8/2 |
| 3 | 1/3 | 2/3 | 3/3 | 4/3 | 5/3 | 6/3 | 7/3 | 8/3 |
| 4 | 1/4 | 2/4 | 3/4 | 4/4 | 5/4 | 6/4 | 7/4 | 8/4 |
| 5 | 1/5 | 2/5 | 3/5 | 4/5 | 5/5 | 6/5 | 7/5 | 8/5 |
| 6 | 1/6 | 2/6 | 3/6 | 4/6 | 5/6 | 6/6 | 7/6 | 8/6 |
| 7 | 1/7 | 2/7 | 3/7 | 4/7 | 5/7 | 6/7 | 7/7 | 8/7 |
| 8 | 1/8 | 2/8 | 3/8 | 4/8 | 5/8 | 6/8 | 7/8 | 8/8 |

(c)

| i/j | 5 | 4 | 6 | 3 | 7 | 2 | 8 | 1 |
|-----|---|---|---|---|---|---|---|---|
| 5 | 5/5 | 4/5 | 6/5 | 3/5 | 7/5 | 2/5 | 8/5 | 1/5 |
| 4 | 5/4 | 4/4 | 6/4 | 3/4 | 7/4 | 2/4 | 8/4 | 1/4 |
| 6 | 5/6 | 4/6 | 6/6 | 3/6 | 7/6 | 2/6 | 8/6 | 1/6 |
| 3 | 5/3 | 4/3 | 6/3 | 3/3 | 7/3 | 2/3 | 8/3 | 1/3 |
| 7 | 5/7 | 4/7 | 6/7 | 3/7 | 7/7 | 2/7 | 8/7 | 1/7 |
| 2 | 5/2 | 4/2 | 6/2 | 3/2 | 7/2 | 2/2 | 8/2 | 1/2 |
| 8 | 5/8 | 4/8 | 6/8 | 3/8 | 7/8 | 2/8 | 8/8 | 1/8 |
| 1 | 5/1 | 4/1 | 6/1 | 3/1 | 7/1 | 2/1 | 8/1 | 1/1 |

(d)

| i/j | 1 | 2 | 3 | 4 | 5 | 6 | 7 | 8 |
|-----|---|---|---|---|---|---|---|---|
| 1 | 1/1 | 2/1 | 3/1 | 4/1 | 5/1 | 6/1 | 7/1 | 8/1 |
| 2 | 1/2 | 2/2 | 3/2 | 4/2 | 5/2 | 6/2 | 7/2 | 8/2 |
| 3 | 1/3 | 2/3 | 3/3 | 4/3 | 5/3 | 6/3 | 7/3 | 8/3 |
| 4 | 1/4 | 2/4 | 3/4 | 4/4 | 5/4 | 6/4 | 7/4 | 8/4 |
| 5 | 1/5 | 2/5 | 3/5 | 4/5 | 5/5 | 6/5 | 7/5 | 8/5 |
| 6 | 1/6 | 2/6 | 3/6 | 4/6 | 5/6 | 6/6 | 7/6 | 8/6 |
| 7 | 1/7 | 2/7 | 3/7 | 4/7 | 5/7 | 6/7 | 7/7 | 8/7 |
| 8 | 1/8 | 2/8 | 3/8 | 4/8 | 5/8 | 6/8 | 7/8 | 8/8 |

(e)

| i/j | 5 | 4 | 6 | 3 | 7 | 2 | 8 | 1 |
|-----|---|---|---|---|---|---|---|---|
| 5 | 5/5 | 4/5 | 6/5 | 3/5 | 7/5 | 2/5 | 8/5 | 1/5 |
| 4 | 5/4 | 4/4 | 6/4 | 3/4 | 7/4 | 2/4 | 8/4 | 1/4 |
| 6 | 5/6 | 4/6 | 6/6 | 3/6 | 7/6 | 2/6 | 8/6 | 1/6 |
| 3 | 5/3 | 4/3 | 6/3 | 3/3 | 7/3 | 2/3 | 8/3 | 1/3 |
| 7 | 5/7 | 4/7 | 6/7 | 3/7 | 7/7 | 2/7 | 8/7 | 1/7 |
| 2 | 5/2 | 4/2 | 6/2 | 3/2 | 7/2 | 2/2 | 8/2 | 1/2 |
| 8 | 5/8 | 4/8 | 6/8 | 3/8 | 7/8 | 2/8 | 8/8 | 1/8 |
| 1 | 5/1 | 4/1 | 6/1 | 3/1 | 7/1 | 2/1 | 8/1 | 1/1 |

HALL SENSOR

BACKGROUND OF THE INVENTION

The present disclosure relates to a Hall sensor, in particular a Hall sensor having a plurality of Hall sensing elements.

Integrated Hall sensors usually have an offset that may be in the range of 10 mT. It is well-known to reduce such offset by using a current spinning technique. Such a current spinning technique produces an arithmetic sum or difference of several measurements taken, while commuting the electrical contacts of the Hall sensor. The resulting arithmetic sum or difference usually still contains some small offset, which often is called a residual offset. A common range for such a residual offset is between 20 µT and 200 µT for lateral Hall sensors and between 200 µT and 2 mT for vertical Hall sensors. For several applications like measuring the horizontal component of the magnetic field of the earth, such residual offset range is still too high. For example, a horizontal component of the earth magnetic field is around 20 µT.

SUMMARY OF THE INVENTION

The present disclosure provides an improved Hall sensor concept that allows measurement with further reduced residual offset.

In a previous application of the applicant, WO 2013/053534 A1, which led to European patent EP 2766740 B1 and is also published as US 2014/0327435 A1 in the national phase, a Hall sensor is described that comprises a plurality of Hall sensing elements that are interconnected in a grid structure between sensor terminals of the Hall sensor. The content of these publications is incorporated herein in its entirety. Due to this grid-like interconnection, the plurality of Hall sensing elements can be contacted like a single Hall sensor via the sensor terminals. For example, a matrix-like arrangement, in particular a two or more dimensional grid is formed by the electrical connections of the Hall sensing elements.

The present disclosure is based on the idea that the physical arrangement of the Hall sensing elements may be different from the logical or electrical arrangement resulting from the interconnections between the Hall sensing elements. For example, the single Hall sensing elements are placed in an arrangement grid, e.g. on a semiconductor body, and are interconnected by specific wiring in a connection grid, that is different from the arrangement grid. Each sensing element has an associated connection grid position in the connection grid and an arrangement grid position in the arrangement grid. These two positions are different when comparing the two grids. For example, Hall sensing elements that are neighbouring, i.e. are located adjacently in the arrangement grid may not be connected to each other in the connection grid. Hence, production effects in one area of the arrangement grid may have a reduced effect on the residual offset due to the different electrical interconnection.

An exemplary embodiment of a Hall sensor according to the improved Hall sensor concept comprises at least four sensor terminals for connecting the Hall sensor. The Hall sensor further has a plurality of Hall sensing elements having element terminals. The Hall sensing elements are interconnected with the element terminals at connection grid positions in a connection grid in between the sensor terminals, wherein the connection grid has more than one dimension, i.e. is at least two-dimensional. The Hall sensing elements are physically arranged at arrangement grid positions in an arrangement grid having more than one dimension and being different from the connection grid. For at least some, in particular a majority, of the Hall sensing elements, the associated connection grid position is different from the associated arrangement grid position. At least some of the Hall sensing elements are connected to at least two adjacently Hall sensing elements in the connection grid. For example, a majority of the Hall sensing elements are connected to at least two adjacently Hall sensing elements in the connection grid. In some implementations, each of the Hall sensing elements is connected to at least two adjacently Hall sensing elements in the connection grid.

Preferably, each of the Hall sensing elements is configured to provide an individual sensor value between two of its element terminals. Furthermore, preferably the Hall sensing elements interconnected in the connection grid can be contacted like a single Hall sensor via the sensor terminals.

With such embodiments where the arrangement grid is different from the connection grid, it is departed from an exclusive use of local neighborhood connections. Instead, longer distance electrical connections to at least second neighbors are employed. For example, symmetric effects that are favourable for a good residual offset may be used for placement of the electrically interconnected Hall sensing elements.

According to some implementations, the Hall sensing elements of at least one gridline of the arrangement grid are connected to Hall sensing elements within the connection grid, which are not adjacently located within the arrangement grid. For example, such a gridline is defined by a horizontal or a vertical line of Hall sensing elements, for example a row or a column of a grid. Hence, for example two gridlines that are electrically interconnected are physically arranged apart from each other in the arrangement grid, e.g. having at least one further gridline of Hall sensing elements being physically arranged between the two interconnected gridlines.

In some implementations the connection grid comprises a first, a second and a third gridline, wherein the Hall sensing elements of the second gridline of the connection grid are connected in between the Hall sensing elements of the first and the third gridline of the connection grid. Furthermore, the Hall sensing elements of the further gridline of the connection grid are physically arranged in between the Hall sensing elements of the second and the third gridline of the connection grid. In such an implementation, e.g. the first and the second gridline of the connection grid are not necessarily directly connected to each other but may have further gridlines in between. However, such direct connection is not excluded either.

In various implementations of a Hall sensor according to the improved Hall sensor concept the connection grid and the arrangement grid are each structured grids having a first and a second dimension and each comprise gridlines along each of the first and the second dimension. Such a structured grid may also be known as a regular grid and may, for example, be embodied with a Cartesian grid. In particular, such a structured grid has a regular topology, which does not necessarily condition a regular size of grid cells. However, if same or similar Hall sensing elements are used, also the geometry of the structured grid may be regular.

In such a structured grid with gridlines along the two dimensions each Hall sensing element may be identified by a unique index for each of the two dimensions, like elements within a matrix. Due to the difference between the connection grid and the arrangement grid, such indices for one arbitrarily chosen Hall sensing element may differ between the definition in the connection grid and the definition in the arrangement grid. In other words, each arrangement grid position or connection grid position is defined by two respective indices, one for each of the two dimensions of the arrangement grid, respectively the connection grid. These indices hence correspond to intersections of the gridlines of the two dimensions.

In a specific implementation with such a structured grid, each gridline in the connection grid has exactly one gridline in the arrangement grid as a counterpart, such that said gridline in the connection grid and said counterpart gridline in the arrangement grid share the same Hall sensing elements. Hence, for example, a same set of Hall sensing elements may be interconnected in one gridline of the connection grid and be arranged in one gridline of the arrangement grid. Preferably, such counterparting gridlines are found in the same dimension.

In a specific implementation with the structured grids, the Hall sensing elements of at least one gridline of the first dimension of the arrangement grid are connected to Hall sensing elements of a gridline of the first dimension of the connection grid, which is not physically arranged adjacently to the at least one gridline of the first dimension of the arrangement grid. Preferably also the Hall sensing elements of at least one gridline of the second dimension of the arrangement grid are connected to Hall sensing elements of a gridline of the second dimension of the connection grid, which is not physically arranged adjacently to the at least one gridline of the second dimension of the arrangement grid.

In a further implementation with the structured grids, for each two gridlines of the gridlines of at least one dimension being directly connected in a connection grid, a position distance of said gridlines in the arrangement grid is less than or equal to 2. For example, exactly one further gridline is physically arranged in between the two gridlines that are electrically interconnected in the connection grid. This may apply to both dimensions.

In some implementations with the structured grids, an ordering of gridlines of the connection grid and an ordering of gridlines of the arrangement grid are, for at least one dimension, related by a permutation function. For example, there is no arbitrary ordering, respectively reordering, of the gridlines but a specific ordering that allows a balanced arrangement of the Hall sensing elements, e.g. employing symmetric effects.

For example, the permutation function orders the gridlines of a first contiguous half of the gridlines of the connection grid in between the gridlines of a second contiguous half of the gridlines of the connection grid. Hence, the permutation function achieves the ordering of gridlines of the arrangement grid. This allows that gridlines of the first contiguous half, which are consecutive in the connection grid, are ordered in a reverse order between consecutive gridlines of the second contiguous half of the connection grid, such that the ordering of gridlines of the arrangement grid is achieved.

Imagining the connection grid, respectively the Hall sensing elements of the connection grid, being shown on a piece of paper, the ordering in the reverse order corresponds to a folding of the paper along an axis defined by the middle or approximately the middle of the connection grid, having sufficient space assumed between the individual Hall sensing elements.

According to some implementations the permutation function may be defined by $$i\_arr\_grid = \begin{cases} N - 2(i\_conn\_grid - 1) & \text{for } i\_conn\_grid \leq \frac{N}{2} \text{ and } N \text{ is even} \\ 1 - (N - 2(i\_conn\_grid - 1)) & \text{for } i\_conn\_grid > \frac{N}{2} \text{ and } N \text{ is even} \\ 1 - (2i\_conn\_grid - N) & \text{for } i\_conn\_grid < \frac{N}{2} \text{ and } N \text{ is odd} \\ 2i\_conn\_grid - N & \text{for } i\_conn\_grid > \frac{N}{2} \text{ and } N \text{ is odd} \end{cases},$$

wherein i_arr_grid denotes the position number of the gridline in the arrangement grid, i_conn_grid denotes the position number of the gridline in the connection grid, and N denotes the number of gridlines present in the arrangement grid and the connection grid for the respective dimension. In this function it is distinguished between an odd and an even number N of gridlines along one dimension.

In the various implementations of the Hall sensor with the structured grid, the Hall sensing elements of at least one gridline in the connection grid may be arranged with a different orientation with respect to the alignment or bearing of the Hall sensing elements of a gridline in the connection grid being adjacently to said at least one gridline in the connection grid.

The Hall sensing elements may be formed of lateral Hall sensor elements in the various embodiments described above. Such lateral Hall sensing elements may have a quadratic or rectangular shape and have four terminals arranged at each side of such a rectangle, respectively. As an alternative, the corners of such rectangles may be used for providing the element terminals. Additional both element terminals at the sides and at the corners may be provided, such that eight element terminals are present. Other well-known shapes may be used instead, in particular cruciform shapes.

In a similar fashion, also vertical Hall sensing elements can be used, which also can be embodied with four respectively five element terminals, corresponding to the lateral Hall sensor element with four element terminals. Furthermore, vertical Hall sensing elements with eight, respectively nine, element terminals can be used.

For example, if vertical Hall sensing elements having four or five element terminals are used, these sensor elements can be interconnected in the connection grid by means of exactly two metal layers of a semiconductor chip, assuming an integration of the Hall sensor on such a chip. If vertical Hall sensing elements having eight or nine element terminals are used, these can be interconnected in the connection grid by means of exactly three metal layers of a semiconductor chip. Hence, although the arrangement of the Hall sensing elements differs from their electrical interconnection, only little additional effort is needed for an implementation of the wiring on a semiconductor chip. This becomes particularly effective if symmetry or mirror properties are utilized. Furthermore, little additional effort is needed even in case minimum or almost minimum distances for placing the Hall sensing elements are employed.

In general, by implementing the improved Hall sensor concept a layout of an area of a semiconductor body carrying the Hall sensing elements may be changed without changing the electrical properties of the underlying arrangement. Hence, an optimization of the used area can be performed.

The invention will be described in detail below for several embodiments with reference to the drawings. Identical reference numerals designate elements or components with identical functions. In so far as elements or components correspond to one another in function, a description of them will not be repeated in each of the following figures.

BRIEF DESCRIPTION OF THE DRAWINGS

In the figures:

FIG. 10 shows example representations of a plurality of Hall sensing elements in a connection grid and in an arrangement grid; and FIG. 11 shows further example representations of a plurality of Hall sensing elements in a connection grid and in an arrangement grid.

DETAILED DESCRIPTION

Figure 1:
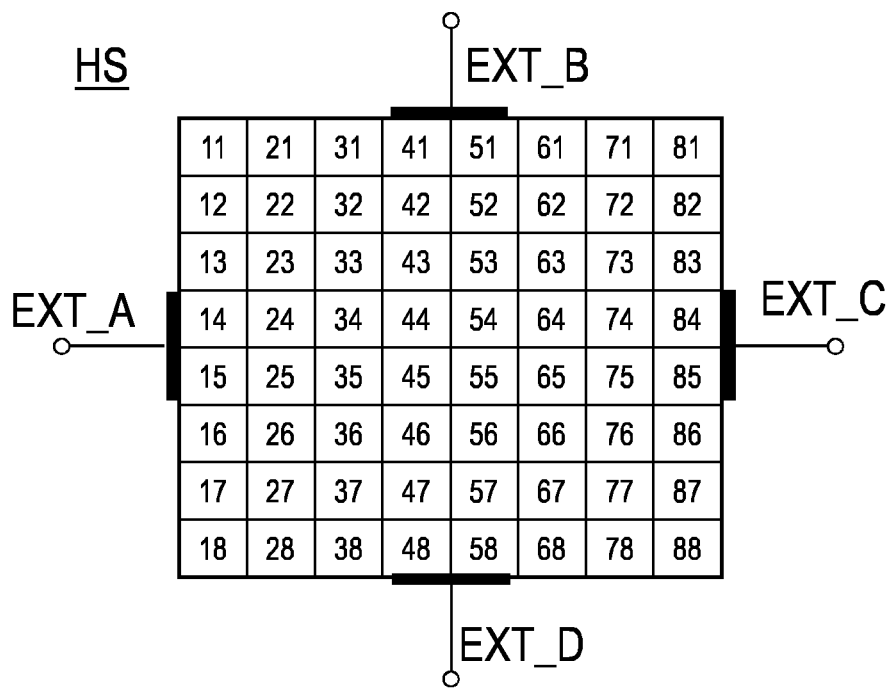
FIG. 1 shows an exemplary embodiment of a Hall sensor with a plurality of Hall sensing elements interconnected in a connection grid.

FIG. 1 shows an example embodiment of a Hall sensor according to the improved Hall sensor concept. The Hall sensor HS comprises a plurality of Hall sensing elements 11, 12, ..., 88 that are interconnected in a connection grid in between sensor terminals EXT_A, EXT_B, EXT_C, EXT_D. Each of the Hall sensing elements 11, 12, ..., 88 has element terminals (not shown) which are used for interconnecting the respective Hall sensing elements with each other to form the connection grid, and for connecting the connection grid, in particular at the outer Hall sensing elements, to the sensor terminals EXT_A to EXT_D. In particular, the sensor terminal EXT_A is connected to the Hall sensing elements 14, 15, the sensor terminal EXT_B is connected to the Hall sensing elements 41, 51, the sensor terminal EXT_C is connected to the Hall sensing elements 84, 85 and the sensor terminal EXT_D is connected to the Hall sensing elements 48, 58. For example, all Hall sensor elements 11, 12, ..., 88 have an identical design. Due to the larger number of Hall sensor elements, the residual offset voltage can be additionally reduced.

In this example configuration an 8×8 grid is formed of the Hall sensing elements, wherein the size of 8×8, resulting in 64 Hall sensing elements, is chosen arbitrarily. In alternative implementations also a greater or smaller number can be chosen, and also the sizes of the grid in each dimension can be chosen differently.

Each of the Hall sensing elements 11 to 88 is configured to provide an individual sensor value between two of its element terminals. Furthermore, the Hall sensing elements 11 to 88 interconnected in the connection grid can be contacted like a single Hall sensor via the sensor terminals EXT_A to EXT_D.

Such a grid-like connection is also described in applicant's previous international application WO 2013/053534 A1, which led to European patent EP 2766740 B1 and is also published as US 2014/327435 A1.

Accordingly, the interconnection of the Hall sensing elements results in a larger Hall sensor with improved accuracy or sensitivity. In addition, the interconnection of the Hall sensing elements makes it possible to reduce an offset voltage or residual offset voltage of the Hall sensor, particularly in relation to a conventional Hall sensor with similar size. This is a consequence, among other things, of a Hall voltage distributing over the individual Hall sensing elements at the sensor terminals and thusly reducing the electric field in the individual Hall sensing elements. The reduced electric field results in an improved behavior with respect to the residual offset.

Externally, the Hall sensor can be operated like a conventional Hall sensor and, in particular, also interconnected to other Hall sensors. Furthermore, it is possible to operate such a Hall sensor with conventional techniques such as the Current-Spinning technique and Pairing in order to realize an additional reduction in the offset voltages or residual offset voltages.

Figure 2:
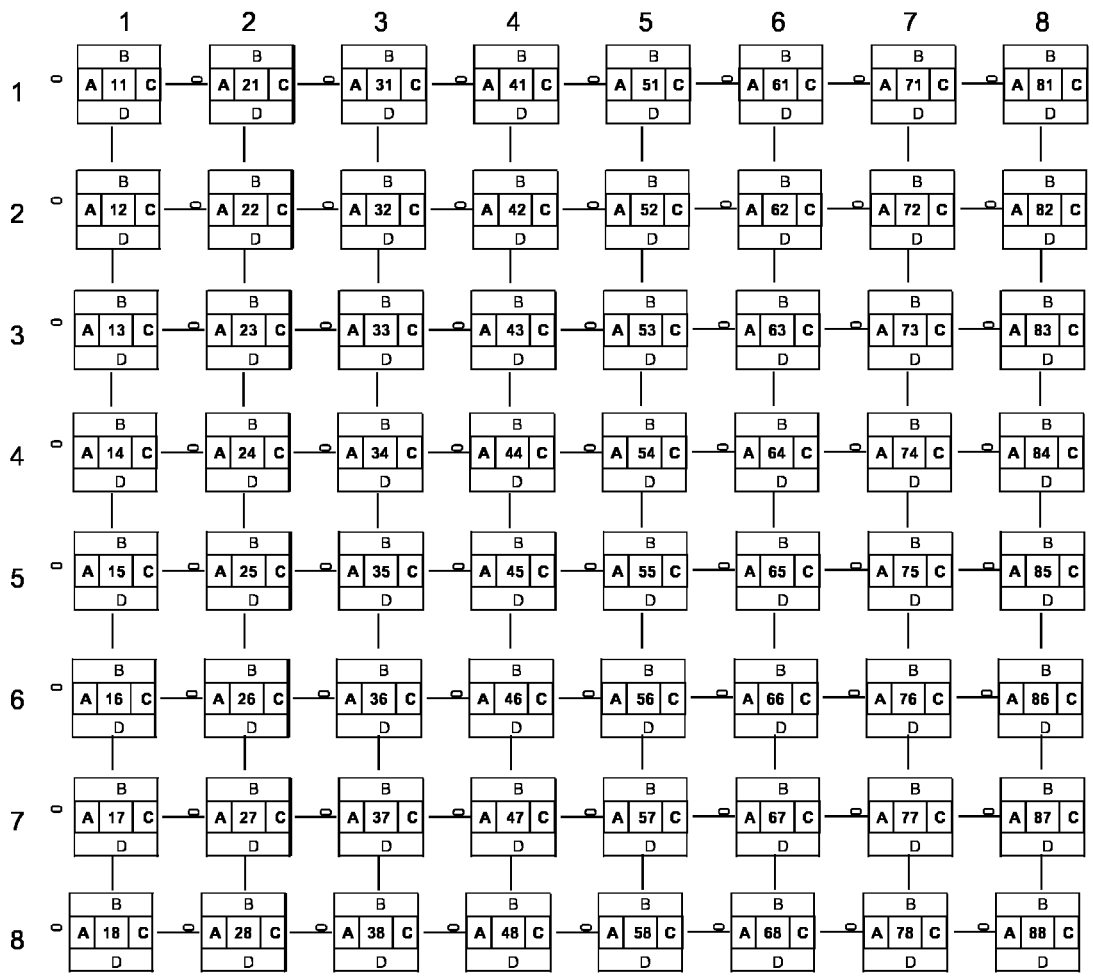
FIG. 2 shows an example embodiment of a plurality of Hall sensing elements interconnected in a connection grid.

FIG. 2 shows an example implementation of a connecting scheme of a connecting grid formed by the Hall sensing elements 1 to 88, which may be employed in the Hall sensing elements of FIG. 1. For example, all of the Hall sensing elements, except the Hall sensing elements of columns 1 and 8 and rows 1 and 8, are connected to each neighbouring Hall sensing element at respective element terminals A, B, C, D. For example, Hall sensing element 33 is connected to its four neighbours, Hall sensing elements 23, 32, 43 and 34.

More generally speaking, at least some or a majority of the Hall sensing elements 11 to 88 are connected to at least two adjacently Hall sensing elements in the connection grid. In some implementations, each of the Hall sensing elements 11 to 88 is connected to at least two adjacently Hall sensing elements in the connection grid.

In the embodiments of FIG. 1 and FIG. 2 the connection grid is in the form of a regular grid or structured grid.

According to the improved Hall sensor concept, the Hall sensing elements of the Hall sensor are physically arranged in an arrangement grid that is different from the layout of the connection grid. Referring to FIGS. 1 and 2, this means that the positions shown in the connection grid do not necessarily correspond to the physical positions of the Hall sensing elements in an arrangement grid. Preferably there is some kind of transformation between the positioning between the connection grid and the arrangement in the arrangement grid. Within such transformation it can be achieved that effects being present in one area of the arrangement grid, which may affect the residual offset of the overall Hall sensor, can be balanced out due to the different electrical connections in the connection grid.

Preferably, the Hall sensor with the plurality of Hall sensing elements is implemented on a semiconductor chip, wherein both the Hall sensing elements themselves and respective wiring for forming the connection grid, are in or on a semiconductor substrate. For example, the wiring may be implemented with respective metal layers on the semiconductor chip that are in appropriate contact with the respective Hall sensing elements.

Figures 3, 4:
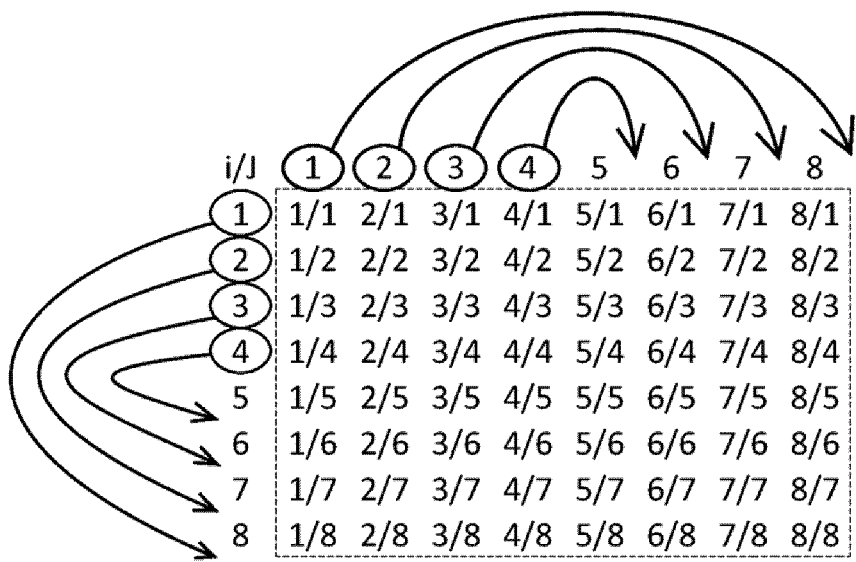
FIG. 3 shows a graphical example implementation of a transformation from a connection grid to an arrangement grid.
FIG. 4 shows an example implementation of an arrangement grid.

FIG. 3 shows an example implementation of a transformation from a connection grid into an arrangement grid. The connection grid is implemented as a structured grid with a first and a second dimension denoted by indices I for columns and J for rows. Each Hall sensing element is electrically placed at the respective index combination, e.g. Hall sensing element 11 at position 1/1 etc.

In this example transformation implementation a reordering of gridlines of the first and the second dimension is performed, in this example with a permutation function. For example, the gridlines of the first dimension correspond to rows of the structured grid and the gridlines of the second dimension correspond to columns of the structured grid.

In this example implementation the permutation function orders the gridlines of a first contiguous half of gridlines of the connection grid, namely rows 1, 2, 3, 4 and columns 1, 2, 3, 4, in between the gridlines of a second contiguous half of the gridlines of the connection grid, namely rows, respectively columns, 5, 6, 7, 8.

Specifically, this is done by performing the reordering such that gridlines of the first contiguous half, which are consecutive in the connection grid, are ordered in reverse order between consecutive gridlines of the second contiguous half of the connection grid. The ordering is made visible in FIG. 3 by the respective arrows placing the columns, respectively rows, at their new positions.

Imagining the connection grid of FIG. 3, respectively the Hall sensing elements of the connection grid, being shown on a piece of paper, the ordering in the reverse order corresponds to a folding of the paper along an axis defined by the middle or approximately the middle of the connection grid, having sufficient space assumed between the individual Hall sensing elements. Here such axis would be assumed between columns respectively rows 4 and 5.

It should be noted the preferably each gridline in the connection grid has exactly one gridline in the arrangement grid as a counterpart, such that said gridline in the connection grid and said counterpart gridline in the arrangement grid share the same Hall sensing elements. For example, Hall sensing elements 11 to 18, belonging to the gridline formed by the first column, also form a respective gridline in the arrangement grid, in particular a column of the arrangement grid.

Performing the transformation, respectively permutation, indicated in FIG. 3, results in an arrangement grid as shown in FIG. 4. In particular, FIG. 4 shows the physical arrangement of the Hall sensing elements 11 to 88, e.g. on a semiconductor chip. As indicated above in the description of FIG. 3, the first column of the connection grid with Hall sensing elements 11 to 18 is arranged as the eighth column in the arrangement grid.

The actual wiring or interconnection of the respective Hall sensing elements 11 to 88 is not shown in FIG. 4 for the sake of a better overview. However, for example the interconnection is performed as indicated in FIG. 2, for example. However, other interconnection schemes are also possible, which will be described later in connection with FIGS. 7 and 8.

In the implementations shown in FIG. 3 and FIG. 4 the reordering of the gridlines of the connection grid to achieve a corresponding arrangement grid is performed for both the first and the second dimension. However, the advantageous effects of the rearrangement come into effect also for other rearrangements, e.g. for rearranging only gridlines of one of the two dimensions. A respective arrangement grid with only one dimension being rearranged readily becomes apparent for the skilled person from the explanations above. In more general implementations of the improved Hall sensor concept, the Hall sensing elements 11 to 88 of at least one gridline of the first dimension of the arrangement grid are connected to Hall sensing elements of a gridline of the first dimension of the connection grid, which is not physically arranged adjacently or neighbouring to the at least one gridline of the first dimension of the arrangement grid. Accordingly, other reorderings can be performed than that shown in FIG. 3 and FIG. 4.

Furthermore, the reordering of gridlines of the connection grid to achieve the arrangement grid can also be performed for other sizes of the connection grid. Assuming, e.g., 16 consecutive gridlines along the first or the second dimension, denoted by
[01;02;03;04;05;06;07;08;09;10;11;12;13;14;15;16]
may result in an arrangement grid having reordered gridlines denoted by
[09;08;10;07;11;06;12;05;13;04;14;03;15;02;16;01].

However, a different layout in the arrangement grid can be achieved using a permutation denoted by
[09;08;07;10;11;06;05;12;13;04;03;14;15;02;01;16],
thus employing groups of two.

A routing complexity for the latter permutation with respect to the wiring of the connection grid is the same as for the first permutation denoted above.

The latter permutation employing groups of two may also be called a common centroid permutation.

The permutation may be performed both for the number of gridlines along a dimension being even and being odd. The resulting arrangement grid with an odd number of gridlines along one dimension readily becomes apparent for the skilled person from the folding example given above. In particular, due to the odd number of gridlines, there is one smaller contiguous half in the connection grid and one larger contiguous half in the connection grid. Preferably, the gridlines of the smaller contiguous half are folded in between the gridlines of the larger contiguous half. This will be explained in more detail with respect to FIG. 9A and FIG. 9B.

In some specific implementations, the permutation function may be defined by $$i\_arr\_grid = \begin{cases} N - 2(i\_conn\_grid - 1) & \text{for } i\_conn\_grid \leq \frac{N}{2} \text{ and } N \text{ is even} \\ 1 - (N - 2(i\_conn\_grid - 1)) & \text{for } i\_conn\_grid > \frac{N}{2} \text{ and is even} \end{cases},$$

wherein i_arr_grid denotes the position number of the gridline in the arrangement grid, i_conn_grid denotes the position number of the gridline in the connection grid, and N denotes the number of gridlines present in the arrangement grid and the connection grid for the respective dimension.

Such a permutation function can be applied, as described above, for only one or for both dimensions of the connection grid.

The Hall sensing elements can be lateral Hall sensing elements or vertical Hall sensing elements, which will be described in more detail in the following.

Figure 5A:
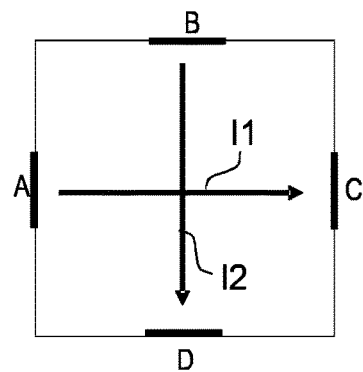
FIGS. 5A and 5B shows example implementations of lateral and vertical Hall sensing elements.

FIG. 5 shows exemplary Hall sensing elements and their potential current flow directions during operation. In this case, FIG. 5A shows an embodiment of a lateral Hall sensing element, in which a current I1 flows from the element terminal A to the element terminal C in one operating phase, e.g., of the spinning-current technique, while a current I2 flows from the element terminal B to the element terminal D in another operating phase. Contacts for the element terminals A, B, C, D are respectively provided, for example, centrally on the sides of the square lateral Hall sensing element shown. Such a lateral Hall sensing element makes it possible to measure a magnetic field perpendicular to the square surface of the element shown.

Figure 5B:
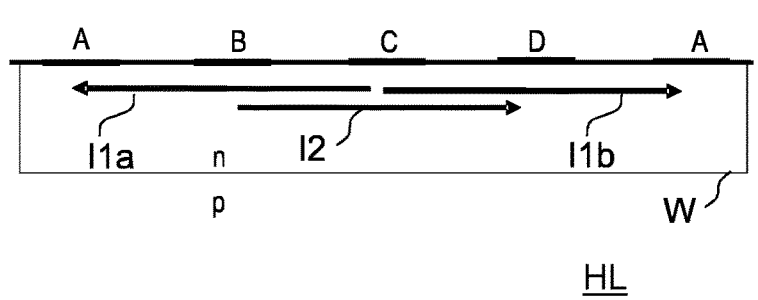

FIG. 5B shows an embodiment of a vertical Hall sensing element, in which an n-doped well W is provided, for example, in a p-doped semiconductor body HL. Contact areas for the element terminals A, B, C, D are respectively provided on the surface of the semiconductor body HL and the well W, wherein the contact for the element terminal A is realized in the form of a double contact or symmetric contact. In other implementations, the element terminal A can be realized in the form of a single contact, such that the Hall sensing element only has four contacts, corresponding to the lateral Hall sensing element illustrated in FIG. 5A.

Analogous to the lateral Hall sensing element illustrated in FIG. 5A, a current flow from the element terminal C to the contacts of the element terminal A that is identified by the current arrows I1a, I1b takes place in the vertical Hall sensing element according to FIG. 5B in a first operating phase. In a second operating phase, a current flow I2 analogously takes places from the element terminal B to the element terminal D. The Hall sensing element illustrated in FIG. 5B makes it possible to measure a magnetic field parallel to the surface of the semiconductor body HL and the well W. The measurement being carried out particularly concerns a magnetic field that, metaphorically speaking, extends perpendicularly into the illustration in FIG. 5B.

The sensitivity and the residual offset of a vertical Hall sensing element not only depend on the physical distance between the external contacts, but also on a well depth of the well W. In order to obtain a larger vertical Hall sensor, the well depth is therefore increased in conventional Hall sensors. However, the realization of a great well depth is limited by process-related circumstances such that no arbitrary sizes can be achieved in conventional Hall sensors. However, the interconnection of several smaller vertical Hall sensing elements with limited well depth in accordance with the principle described above makes it possible to realize a larger Hall sensor that with respect to the sensor terminals EXT_A, EXT_B, EXT_C, EXT_D acts like a larger Hall sensor.

Figure 6A:
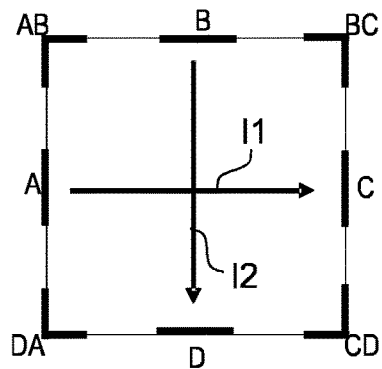
FIGS. 6A and 6B show further example implementations of lateral and vertical Hall sensing elements.
Figure 6B:
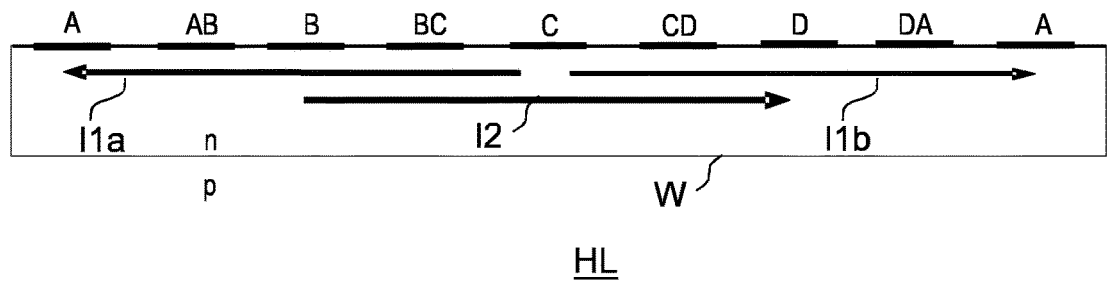

FIG. 6A and FIG. 6B show further embodiments of Hall sensing elements similar to those shown in FIG. 5A and FIG. 5B respectively. However, in this implementation the Hall sensing elements have four additional element terminals AB, BC, CD, DA.

For the lateral Hall sensing element of FIG. 6A, these additional element terminals are placed at the corners of the Hall sensing element. The principle of having additional element terminals located so to say in between the centrally placed element terminals can also be transferred to vertical Hall sensing elements, as shown in FIG. 6B. Hence a vertical Hall sensing element with nine element terminals is achieved. As mentioned above for FIG. 5B, also in FIG. 6B the double contact A of the vertical Hall sensing element can be replaced by a single contact A, resulting in eight element terminals.

For both types of Hall sensing elements, this results in a higher flexibility for contacting the Hall sensing elements. This may especially become useful when interconnecting the single Hall sensing elements in the connection grid according to the improved Hall sensor concept.

Figure 7:
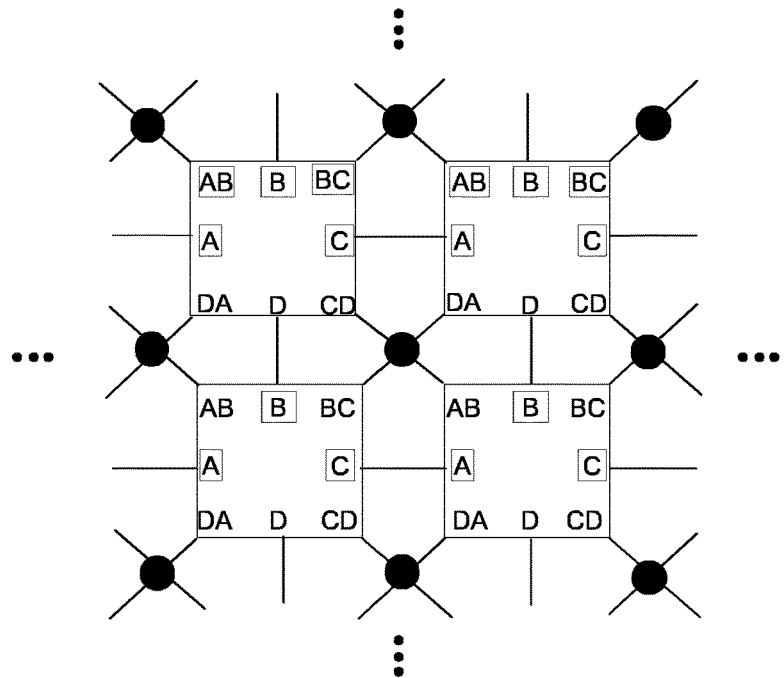
FIG. 7 shows a detail of an example implementation of Hall sensing elements interconnected in a connection grid.

For example, FIG. 7 shows a detail of a connection grid with four Hall sensing elements that are interconnected with each other. Furthermore Hall sensing elements that are placed above, below, to the right or to the left of the four depicted Hall sensing elements, are left out for reasons of a better overview.

As can be seen from FIG. 7, e.g. four Hall sensing elements are interconnected at one of their corner connections respectively element terminals AB, BC, CD, DA. Furthermore, the centrally placed element terminals are connected to the opposite, neighbouring element terminal of the adjacently Hall sensing element. Hence, in such an implementation at least these Hall sensing elements that are not placed at the outer borders of the connection grid are interconnected at all eight element terminals.

Although the Hall sensing elements in FIG. 7 are shown as lateral Hall sensing elements, the same connection scheme for the connection grid may be applied when vertical Hall sensing elements, as shown in FIG. 6B, are used.

Figure 8:
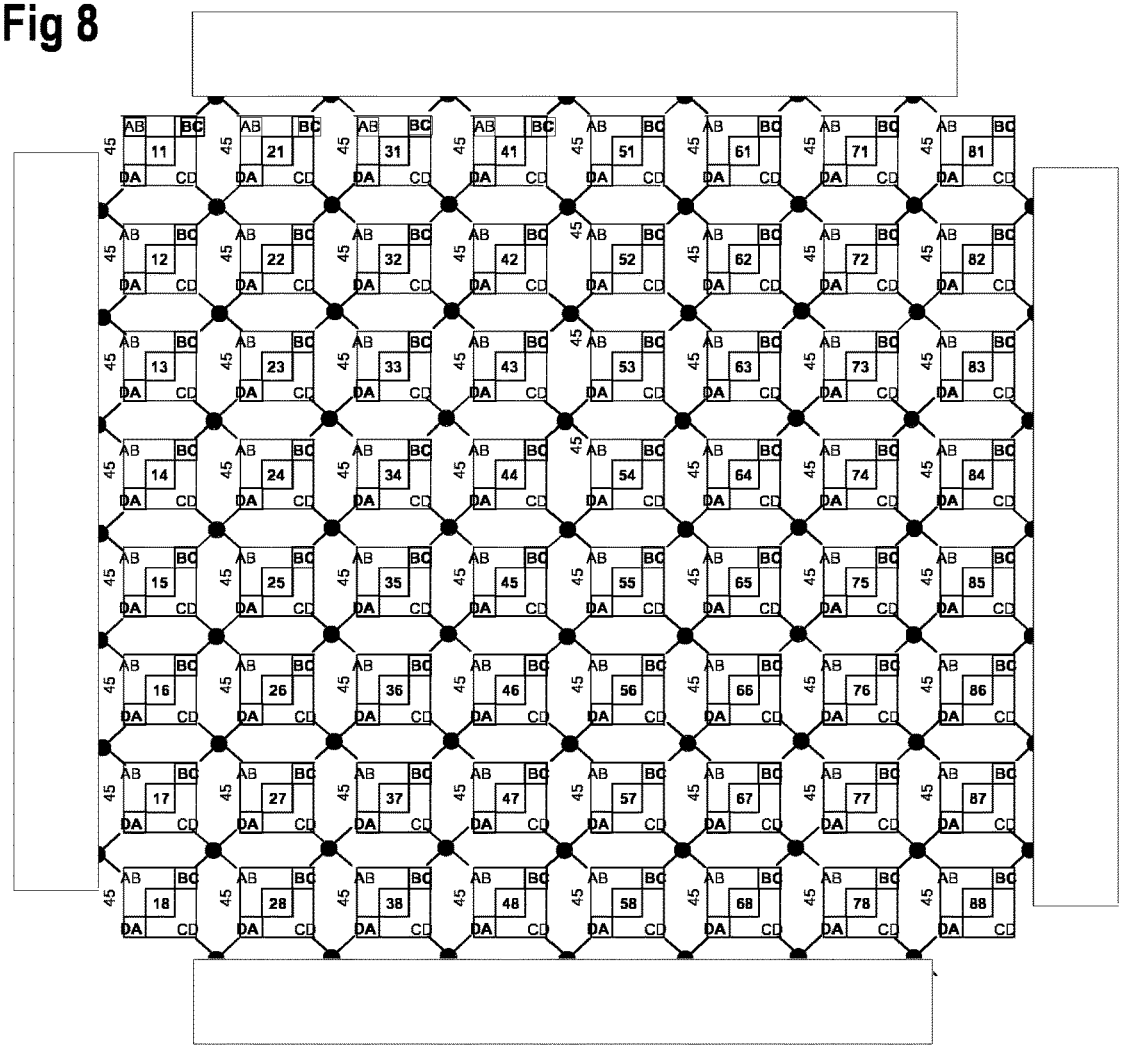
FIG. 8 shows a further example implementation of a plurality of Hall sensing elements interconnected in a connection grid.

FIG. 8 shows an exemplary connection scheme of a connection grid with 8×8 Hall sensing elements. Similar to the implementation of FIG. 7, the Hall sensing elements are interconnected at their corner element terminals AB, BC, CD, DA. The centrally placed element terminals A, B, C, D are not used in this implementation.

FIG. 9 shows an exemplary embodiment of a Hall sensor HS according to the improved Hall sensor concept with an example number of 25 Hall sensing elements 11 to 55 arranged in a 5×5 connection grid.

Figure 9A:
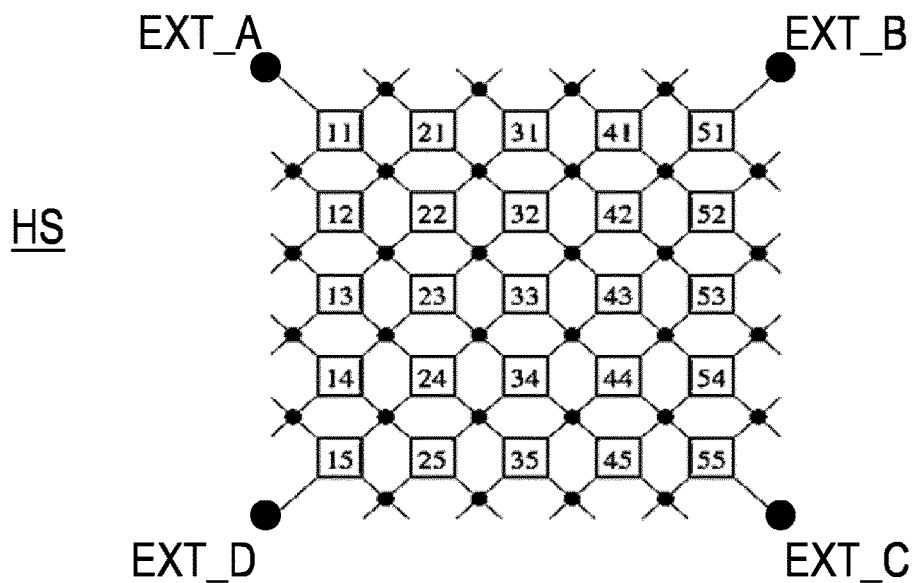
FIGS. 9A and 9B show examples implementations of a Hall sensor according to the improved Hall sensor concept.

In particular, FIG. 9A shows the logical arrangement in the connection grid, wherein the Hall sensing elements 11 to 55 are interconnected at their corner element terminals, as shown in FIG. 8. The external sensor terminals EXT_A, EXT_B, EXT_C, EXT_D of the Hall sensor are connected to the Hall sensing elements 11, 51, 55, 15 placed at the corners of the connection grid. In particular, sensor terminal EXT_A is connected to Hall sensing element 11, sensor terminal EXT_B is connected to Hall sensing element 51, sensor terminal EXT_C is connected to Hall sensing element 55 and sensor terminal EXT_D is connected to Hall sensing element 15.

Figure 9B:
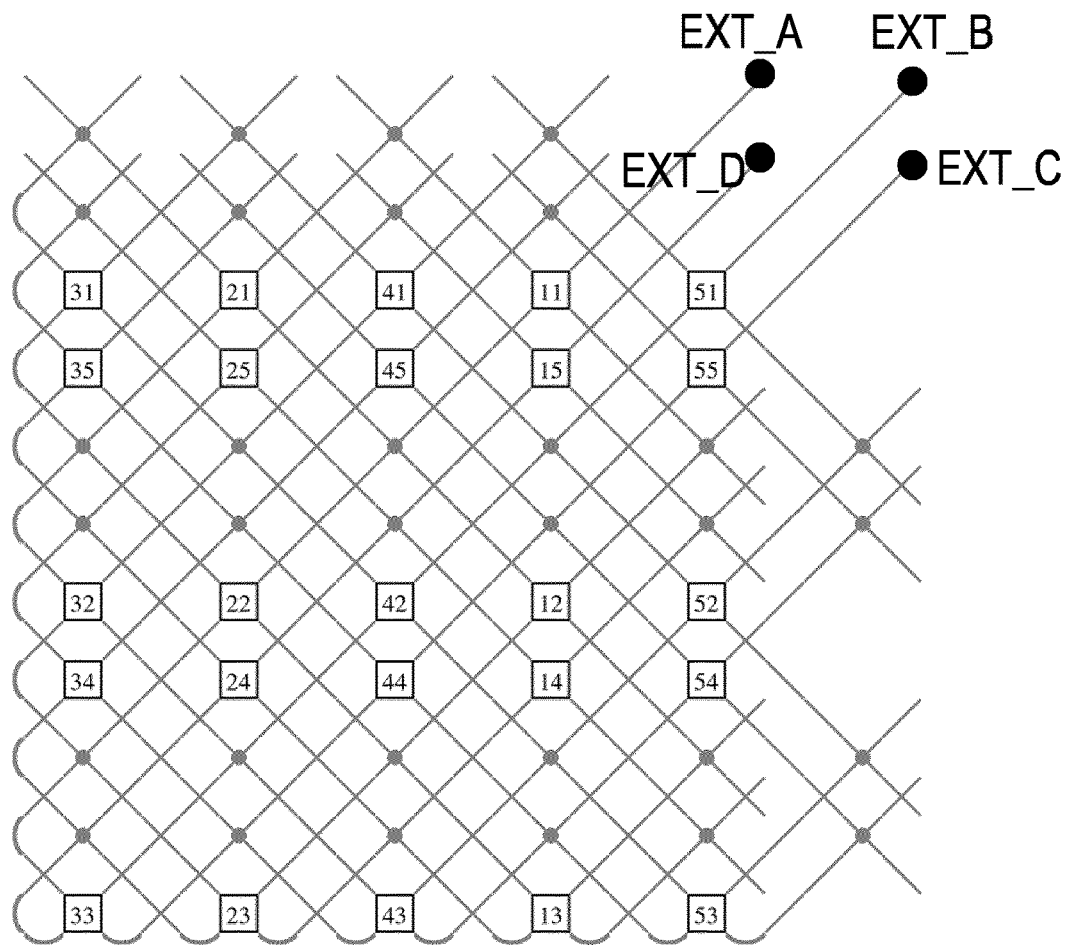

FIG. 9B shows an example implementation of the arrangement grid resulting from a transformation of the connection grid of FIG. 9A. In particular, a permutation has been performed for both the first and the second dimension of the connection grid, resulting in the different physical placement of the Hall sensing elements. In the drawing of FIG. 9B the interconnections of the Hall sensing elements 11 to 55 as defined in FIG. 9A are shown in addition to the placement of the Hall sensing elements. In particular, the wiring of the connection grid is visible in FIG. 9B, wherein crossing lines are only connected at the positions, where a connection dot is shown. Also the contacts to the sensor terminals EXT_A to EXT_D are shown in FIG. 9B.

It should be noted that the Hall sensing elements 11, 51, 55, 15, which form the physical connections of the overall Hall sensor, are located adjacently in the arrangement grid. Hence, if process effects or other effects during manufacturing occur, these most probably will affect all of the Hall sensing elements 11, 51, 55, 15. In consequence, such potential effects will be present or effective at each of the sensor terminals EXT_A to EXT_D, such that signal flows through the Hall sensor HS can be assumed well-balanced.

It should be noted that the first two rows 1 and 5 in the arrangement grid are shown spaced apart from the third and the fourth row 2 and 4 and further apart from the fifth row 3. However, this representation is only made for giving a better overview to the interconnection lines, wherein in the physical arrangement the space between the rows may be omitted accordingly.

The physical arrangement of the arrangement grid shown in FIG. 9B may be achieved by employing a permutation function that is defined by $$i\_arr\_grid = \begin{cases} 1 - (2i\_conn\_grid - N) \text{ for } i\_conn\_grid < \frac{N}{2} \text{ and } N \text{ is odd} \\ 2i\_conn\_grid - N \text{ for } i\_conn\_grid > \frac{N}{2} \text{ and } N \text{ is odd} \end{cases},$$

wherein i_arr_grid denotes the position number of the gridline in the arrangement grid, i_conn_grid denotes the position number of the gridline in the connection grid, and N denotes the number of gridlines present in the arrangement grid and the connection grid for the respective dimension.

It should be apparent for the skilled reader that the number of five rows and columns is only chosen to allow a better overview of the improved Hall sensor concept, while other sizes, in particular larger numbers of rows and columns, can also be employed for implementing the improved Hall sensor concept.

FIG. 10 shows an example implementation of a transformation from a connection grid to an arrangement grid according to the improved Hall sensor concept. Basically, the underlying transformation respectively permutation is the same as shown in FIG. 3 and FIG. 4. In part (a) of FIG. 10 the logical arrangement of the Hall sensing elements 11 to 88 in the connection grid is shown, whereas in part (b) the resulting physical arrangement in the arrangement grid is depicted. As can be seen from parts (a) and (b) the Hall sensing elements lying on the diagonal of the connection grid still lie on the diagonal of the corresponding arrangement grid after transformation, respectively permutation.

As described for FIGS. 9A and 9B, the Hall sensing elements 11, 18, 81 and 88, which may be used for connecting the sensor terminals EXT_A to EXT_D, are physically arranged adjacently in the arrangement grid, resulting in the same effects.

It should be noted that these Hall sensing elements lying on the diagonal may carry signal flows during operation of the Hall sensor, thus utilizing the positive effect of the rearrangement.

FIG. 11 shows several example transformations, wherein in each case four Hall sensing elements are emphasized by respective marking in the drawings. For example, image parts (a) and (b) show the transformation of Hall sensing elements 11, 12, 21, 22. While these Hall sensing elements are neighbouring in the logical connection grid of part (a), they are placed apart in the physical arrangement grid of part (b). However, a distance between one of the Hall sensing elements and its adjacent neighbour in the connection grid is two for each case, i.e. there is exactly one other Hall sensing element arranged in between with respect to the arrangement grid.

A similar situation is present for Hall sensing element 33, 34, 43, 44 shown in image parts (c) and (d), which also are emphasized by respective marking in the drawings. Accordingly, also in this case a positional distance between the Hall sensing elements with respect to the arrangement grid shown in part (d) is two for each of the Hall sensing elements 33, 34, 43, 44 logically located adjacently in the connection grid shown in part (c). The same transformational behaviour can be seen from image parts (e) and (f), (g) and (h), and (i) and (j). In all of the latter named cases, the position distance of the neighbouring Hall sensing elements in the connection grid, shown in parts (e), (g) and (i), is equal to two in the arrangement grid, shown in parts (f), (h) and (j). This also applies for the whole gridline, to which the Hall sensing elements belong in the connection grid.

In image parts (k) and (l) of FIG. 11, Hall sensing elements 44, 45, 54, 55 are transformed to a physical position in the arrangement grid shown in part (l) in the upper left corner. In this case, different to the previously described cases, the four Hall sensing elements are also physically arranged adjacently within the arrangement grid.

Hence a position distance of said Hall sensing elements in the arrangement grid is one, which is less than two.

In the embodiment and implementations described above several ways of providing a different placement of Hall sensing elements within a connection grid and within an arrangement grid are provided. Such different placement provides positive effects for the measurements with an overall Hall sensor comprising the Hall sensing elements. In particular, a residual offset can be reduced compared to conventional solutions.

Although arbitrary transformations between the connection grid and the arrangement grid are possible, it may be expedient to use symmetry properties as the basis for the transformation. For example, a mirror symmetry may be used, resulting in the above-described folding of the logical structure defined by the connection grid in order to achieve the physical arrangement of the arrangement grid.

A mirror symmetry or a chirality may be employed by performing the folding along two axis, one for each of the two dimensions.

The above-mentioned symmetries may suppress disturbances of imperfections being present or resulting from a production process, in particular if the homogeneity radius is greater than the size of two Hall sensing elements. This may be defined as a minimal distance for matching.

In the various embodiments described above, the same orientation with respect to bearing or alignment, e.g. a rotational alignment of the Hall sensing elements can be assumed. However, it is also possible to provide some of the Hall sensing elements with a different orientation, i.e. being connected at different element terminals. For example, the Hall sensing elements of at least one gridline in the connection grid are arranged with a different orientation with respect to the bearing or alignment of the Hall sensing elements of a gridline in the connection grid being adjacent to said at least one gridline in the connection grid. The orientation of the Hall sensing elements may be defined, for example, by a current flow direction through the element or by a geometric structure or by a special structure in a semiconductor well. The technical orientation of a vertical Hall sensing element depends, in particular, on the respective element terminals that are connected for the measurement.

Imperfections that may be addressed with the improved Hall sensor concept may be non-uniform wafer processing gradients of second, third or higher orders, device-related non-linearities like a JFET effect or other known disturbances.

The improved Hall sensor concept is applicable to all macroscopic array shapes such as square shape, rectangular shape, octagonal shape, Greek cross or cruciform shape etc. Furthermore, the improved Hall sensor concept is applicable to various possible macroscopic array contact arrangements like on the sides, on the edges, as well as any number of element terminals.

The improved Hall sensor concept is applicable to all possible 2D-array lattice types, for example simple rectangular, body-centred rectangular, hexagonal etc.

A Hall sensor according to the improved Hall sensor concept may be implemented in a three-dimension Hall sensor arrangement, where one lateral Hall sensor is placed in the centre for measuring e.g. a z-coordinate of the magnetic field, and vertical Hall sensors are placed at each side of the central lateral Hall sensor, resulting in two vertical Hall sensors being present for e.g. an x-coordinate and two vertical Hall sensors being present for measuring a y-coordinate of the magnetic field. Preferably at least the vertical Hall sensors are implemented according to the improved Hall sensor concept described above, but more preferably also the lateral Hall sensor is embodied according to the improved Hall sensor concept.

For example, a Hall sensor according to the improved Hall sensor concept may be used for compass applications with an increased sensitivity due to the reduced residual offset, in particular below 20 µT.

For example, by implementing the improved Hall sensor concept a layout of an area of the semiconductor body may be changed without changing the electrical properties of the underlying arrangement. Hence, an optimization of the used area is performed.

The invention claimed is:

1. A Hall sensor comprising at least four sensor terminals for connecting the Hall sensor and a plurality of Hall sensing elements, wherein:
    each of the Hall sensing elements comprises four element terminals;
    the Hall sensing elements are interconnected with the element terminals according to a logical connection grid in between the sensor terminals, each Hall sensing element having a respective logical connection grid position in the logical connection grid, each Hall sensing element being directly logically adjacent to one or more other ones of the Hall sensing elements in the logical connection grid, each Hall sensing element being directly connected with each of the one or more other ones of the Hall sensing elements to which it is logically adjacent via respective ones of the element terminals, and the logical connection grid having more than one dimension;
    the Hall sensing elements are physically arranged according to a physical arrangement grid, each Hall sensing element having a respective physical arrangement grid position in the physical arrangement grid, the physical arrangement grid having more than one dimension, and the physical arrangement grid being different from the logical connection grid;
    for at least one of the Hall sensing elements, the logical connection grid position of the Hall sensing element is different from the physical arrangement grid position of the Hall sensing element; and
    wherein a first Hall sensing element of the plurality of Hall sensing elements is directly connected to at least a second, a third, a fourth, and a fifth Hall sensing elements of the plurality of Hall sensing elements via respective ones of the element terminals of the first Hall sensing element,
    wherein the first Hall sensing element is directly logically adjacent, in the logical connection grid, to the second, the third, the fourth, and the fifth Hall sensing elements,
    wherein the first Hall sensing element is not directly physically adjacent, in the physical arrangement grid, to the second, the third, the fourth, and the fifth Hall sensing elements,
    wherein one or more sixth Hall sensing elements of the plurality of Hall sensing elements are positioned between the first Hall sensing element and the second Hall sensing element in the physical arrangement grid,
    wherein one or more seventh Hall sensing elements of the plurality of Hall sensing elements are positioned between the first Hall sensing element and the third Hall sensing element in the physical arrangement grid,
    wherein one or more eighth Hall sensing elements of the plurality of Hall sensing elements are positioned between the first Hall sensing element and the fourth Hall sensing element in the physical arrangement grid, and
    wherein one or more ninth Hall sensing elements of the plurality of Hall sensing elements are positioned between the first Hall sensing element and the fifth Hall sensing element in the physical arrangement grid.

2. The Hall sensor according to claim 1,
    wherein the plurality of Hall sensing elements are aligned in the physical arrangement grid along a plurality of gridlines of the physical arrangement grid,
    wherein the Hall sensing elements aligned along at least one gridline of the plurality of gridlines of the physical arrangement grid are directly connected to respective ones of the plurality of Hall sensing elements, wherein at least some of the respective ones of the plurality of Hall sensing elements are not physically adjacent to the Hall sensing elements aligned along the at least one gridline of the plurality of gridlines of the physical arrangement grid.

3. The Hall sensor according to claim 1,
    wherein the plurality of Hall sensing elements are aligned in the logical connection grid according to a plurality of gridlines of the logical connection grid,
    wherein the plurality of gridlines of the logical connection grid comprises a first gridline, a second gridline, and a third gridline,
    wherein the Hall sensing elements aligned along the second gridline of the logical connection grid are directly connected in between the Hall sensing elements aligned along the first gridline of the logical connection grid and the Hall sensing elements aligned along the third gridline of the logical connection grid, and
    wherein the Hall sensing elements aligned along the first gridline of the logical connection grid are physically arranged in between the Hall sensing elements aligned along the second gridline of the logical connection grid and the Hall sensing elements aligned along the third gridline of the logical connection grid.

4. The Hall sensor according to claim 1, wherein the logical connection grid and the physical arrangement grid are structured grids,
    wherein the logical connection grid has a respective first dimension and a respective second dimension from among the more than one dimension of the logical connection grid, and comprises respective gridlines along each of the first dimension and the second dimension of the logical connection grid,
    wherein the physical arrangement grid has a respective first dimension and a respective second dimension from among the more than one dimension of the physical arrangement grid, and comprises respective gridlines along each of the first dimension and the second dimension of the logical connection grid, wherein the plurality of Hall sensing elements are aligned in the logical connection grid according to the gridlines of the logical connection grid, and wherein the plurality of Hall sensing elements are aligned in the physical arrangement grid according to the gridlines of the physical arrangement grid.

5. The Hall sensor according to claim 4, wherein each gridline in the logical connection grid has exactly one gridline in the physical arrangement grid as a counterpart, such that each gridline in the logical connection grid and its corresponding counterpart gridline in the physical arrangement grid share the same Hall sensing elements of the plurality of Hall sensing elements.

6. The Hall sensor according to claim 4, wherein:
the Hall sensing elements aligned along at least one of the gridlines of the first dimension of the physical arrangement grid are directly connected to the Hall sensing elements aligned along one of the gridlines of the first dimension of the logical connection grid that is not arranged physically adjacent to the at least one of the gridlines of the first dimension of the physical arrangement grid; and
the Hall sensing elements aligned along at least one of the gridlines of the second dimension of the physical arrangement grid are directly connected to the Hall sensing elements of one of the gridlines of the second dimension of the logical connection grid that is not arranged physically adjacent to the at least one of the gridlines of the second dimension of the physical arrangement grid.

7. The Hall sensor according to claim 4,
wherein the physical arrangement grid positions are defined by intersections of the gridlines of the first and the second dimensions of the physical arrangement grid, and
wherein the logical connection grid positions are defined by intersections of the gridlines of the first and the second dimensions of the logical connection grid.

8. The Hall sensor according to claim 4,
wherein for each two gridlines of the gridlines of at least one of the first dimension or the second dimension that are logically adjacent in the logical connection grid, a position distance of said gridlines in the physical arrangement grid is less than or equal to two.

9. The Hall sensor according to claim 4,
wherein (i) an order of the gridlines of the logical connection grid is related to (ii) an order of gridlines of the physical arrangement grid according to a permutation function for at least one of the first dimension or the second dimension of each of the logical connection grid or the physical arrangement grid.

10. The Hall sensor according to claim 9,
wherein, according to the permutation function, the order of gridlines of the physical arrangement grid is such that the gridlines of a first contiguous half of the gridlines of the logical connection grid are ordered in between gridlines of a second contiguous half of the gridlines of the logical connection grid.

11. The Hall sensor according to claim 10,
wherein, according to the permutation function, the order of gridlines of the physical arrangement grid is such that the gridlines of the first contiguous half are consecutive in the logical connection grid are ordered in reverse order between the gridlines of the second contiguous half of the logical connection grid.

12. The Hall sensor according to claim 9,
wherein the permutation function for each gridline along the at least one of the first dimension or the second dimension is defined by:

$$i\_arr\_grid = \begin{cases} N - 2(i\_conn\_grid - 1) & \text{for } i\_conn\_grid \le \frac{N}{2} \text{ and } N \text{ is even} \\ 1 - (N - 2(i\_conn\_grid - 1)) & \text{for } i\_conn\_grid > \frac{N}{2} \text{ and } N \text{ is even} \\ 1 - (2i\_conn\_grid - N) & \text{for } i\_conn\_grid < \frac{N}{2} \text{ and } N \text{ is odd} \\ 2i\_conn\_grid - N & \text{for } i\_conn\_grid > \frac{N}{2} \text{ and } N \text{ is odd} \end{cases},$$

wherein i_arr_grid denotes a consecutive position number of a respective gridline of the gridlines of the physical arrangement grid, i_conn_grid denotes a consecutive position number of a respective gridline of the gridlines of the logical connection grid, and N denotes a consecutive position number of gridlines in the physical arrangement grid and the logical connection grid for the at least one of the first dimension or the second dimension.

13. The Hall sensor according to claim 4,
wherein the Hall sensing elements of at least one of the gridlines of the logical connection grid are arranged with a different orientation with respect to an orientation of the Hall sensing elements aligned along another one of the gridlines of the logical connection grid that is logically adjacent to said at least one of the gridlines of the logical connection grid.

14. The Hall sensor according to claim 1, wherein each of the Hall sensing elements is configured to provide an individual sensor value between two of its element terminals.

15. The Hall sensor according to claim 1, wherein the Hall sensing elements interconnected in the logical connection grid are contactable as a single Hall sensor via the sensor terminals.

16. The Hall sensor according to claim 1, wherein the Hall sensing elements comprise vertical Hall sensor elements and wherein:
the vertical Hall sensor elements have four or five element terminals and are interconnected in the logical connection grid by exactly two metal layers of a semiconductor chip; or
the vertical Hall sensor elements have eight or nine element terminals and are interconnected in the logical connection grid by exactly three metal layers of the semiconductor chip.

17. The Hall sensor according to claim 4, wherein the physical arrangement grid positions of each of the Hall sensing elements are identifiable by a respective unique index for each of the first and the second dimensions within the physical arrangement grid, and the logical connection grid positions of each of the Hall sensing elements are identifiable by a respective unique index for each of the first and the second dimensions within the logical connection grid.

18. A Hall sensor comprising at least four sensor terminals for connecting the Hall sensor and a plurality of Hall sensing elements, wherein:
each of the Hall sensing elements comprises four element terminals;

the Hall sensing elements are interconnected with the element terminals according to a logical connection grid in between the sensor terminals, each Hall sensing element being directly logically adjacent to one or more other ones of the Hall sensing elements in the logical connection grid, each Hall sensing element being directly connected with each of the one or more other ones of the Hall sensing elements to which it is logically adjacent;

the Hall sensing elements are physically arranged according to a physical arrangement grid, the physical arrangement grid being different from the logical connection grid;

the logical connection grid and the physical arrangement grid are structured grids, each having a respective first dimension and a respective second dimension, and each comprising respective gridlines along each of the respective first dimension and the respective second dimension;

an order of the gridlines of the logical connection grid is related to an order of the gridlines of the physical arrangement grid according to a permutation function for at least one of the first dimension or the second dimension, wherein the permutation function for each gridline along the at least one of the first dimension or the second dimension is defined by i_arr_grid =

$$\begin{cases} N - 2(\text{i\_conn\_grid} - 1) & \text{for i\_conn\_grid} \leq \frac{N}{2} \text{ and } N \text{ is even} \\ 1 - (N - 2(\text{i\_conn\_grid} - 1)) & \text{for i\_conn\_grid} > \frac{N}{2} \text{ and } N \text{ is even} \\ 1 - (2\text{i\_conn\_grid} - N) & \text{for i\_conn\_grid} < \frac{N}{2} \text{ and } N \text{ is odd} \\ 2\text{i\_conn\_grid} - N & \text{for i\_conn\_grid} > \frac{N}{2} \text{ and } N \text{ is odd} \end{cases},$$

wherein i_arr_grid denotes a consecutive position of a respective gridline of the gridlines of the physical arrangement grid, i_conn_grid denotes a consecutive position of a respective gridline of the gridlines of the logical connection grid, and N denotes a number of gridlines in the physical arrangement grid and the logical connection grid for the at least one of the first dimension or the second dimension, and a first Hall sensing element of the plurality of Hall sensing elements is directly connected to at least a second and a third Hall sensing elements of the plurality of Hall sensing elements via respective ones of the element terminals of the first Hall sensing element, wherein the first Hall sensing element is directly logically adjacent, in the logical connection grid, to the second and the third Hall sensing elements, and wherein the first Hall sensing element is not directly physically adjacent, in the physical arrangement grid, to the second and the third Hall sensing elements.

* * * * *